United States Patent [19]

Jacobson

[11] 3,902,188

[45] Aug. 26, 1975

[54] HIGH FREQUENCY TRANSISTOR

[75] Inventor: David Stanley Jacobson, Flemington, N.J.

[73] Assignee: RCA Corporation, New York, N.Y.

[22] Filed: Aug. 15, 1973

[21] Appl. No.: 388,435

[52] U.S. Cl. ........................ 357/36; 357/20; 357/36; 357/45; 357/51; 357/59; 357/68

[51] Int. Cl.$^2$ ........................................ H01L 29/72

[58] Field of Search ............ 317/235 Z; 357/20, 34, 357/36, 45, 59, 68, 71, 51

[56] References Cited

UNITED STATES PATENTS

| | | | |
|---|---|---|---|
| 3,214,652 | 10/1965 | Knowles | 357/34 |
| 3,462,658 | 8/1969 | Worchel et al. | 317/235 |
| 3,582,726 | 6/1971 | Gilbert et al. | 317/235 |
| 3,602,780 | 8/1971 | Jacobson | 317/235 R |
| 3,609,474 | 9/1971 | Vincent | 317/235 R |
| 3,746,949 | 7/1973 | Nienhuis et al. | 317/235 R |

*Primary Examiner*—Andrew J. James
*Attorney, Agent, or Firm*—H. Christoffersen; M. Epstein

[57] ABSTRACT

The transistor comprises a number of spaced apart emitter sites within a semiconductor wafer connected together by metal contacts overlying the wafer surface. Each emitter site comprises two sections which extend transversely of one another, the configuration of the sites contributing to a greater emitter peripheral length while not increasing the base area. The connection to each emitter site is through a layer of resistive material overlying the wafer surface, the resistive material layer providing ballasting for each site and being so arranged relative to each site to provide relatively uniform ballasting of each portion of each site.

1 Claim, 4 Drawing Figures

HIGH FREQUENCY TRANSISTOR

This invention relates to semiconductor devices, and particularly to transistors for use at high frequencies.

High frequency transistors, such as described in U.S. Pat. No. 3,434,019, issued to Carley on Mar. 18, 1969, comprise a semiconductor body having therein emitter, base, and collector regions. For improving the high frequency performance of such devices, the emitters are shaped to provide a high ratio of emitter peripheral length to emitter area. Also, to provide high current handling capability, with a minimum collector to base capacitance, the ratio of emitter peripheral length to base area should be high.

In one type of such transistors, shown in the aforementioned patent, and known as an "overlay" transistor, the emitter region is segmented into a plurality of spaced-apart emitter sites which are connected together in parallel by metal contacts overlying the semiconductor body surface.

To insure that each emitter site operates uniformly with respect to the other sites, and to prevent current run-away of any given emitter site, it is the practice to provide individual resistance elements, known as ballasting resistors, between each emitter site and the overlying metal contacts. Current through such ballast resistors tends to reduce the forward bias on the emitter sites and thus prevent excessive current thereto. Also, each portion of each emitter site is preferably ballasted relatively uniformly with respect to the other portions thereof to provide uniform current distribution about the periphery of each site. Since, however, each emitter site is preferentially shaped in such manner to maximize the peripheral length while minimizing the area thereof, a need exists for an arrangement whereby, without increasing the complexity and cost of the devices, maximum emitter peripheral length can be provided while still obtaining relatively uniform ballasting of the various portions of each of the emitter sites.

Figure 1:
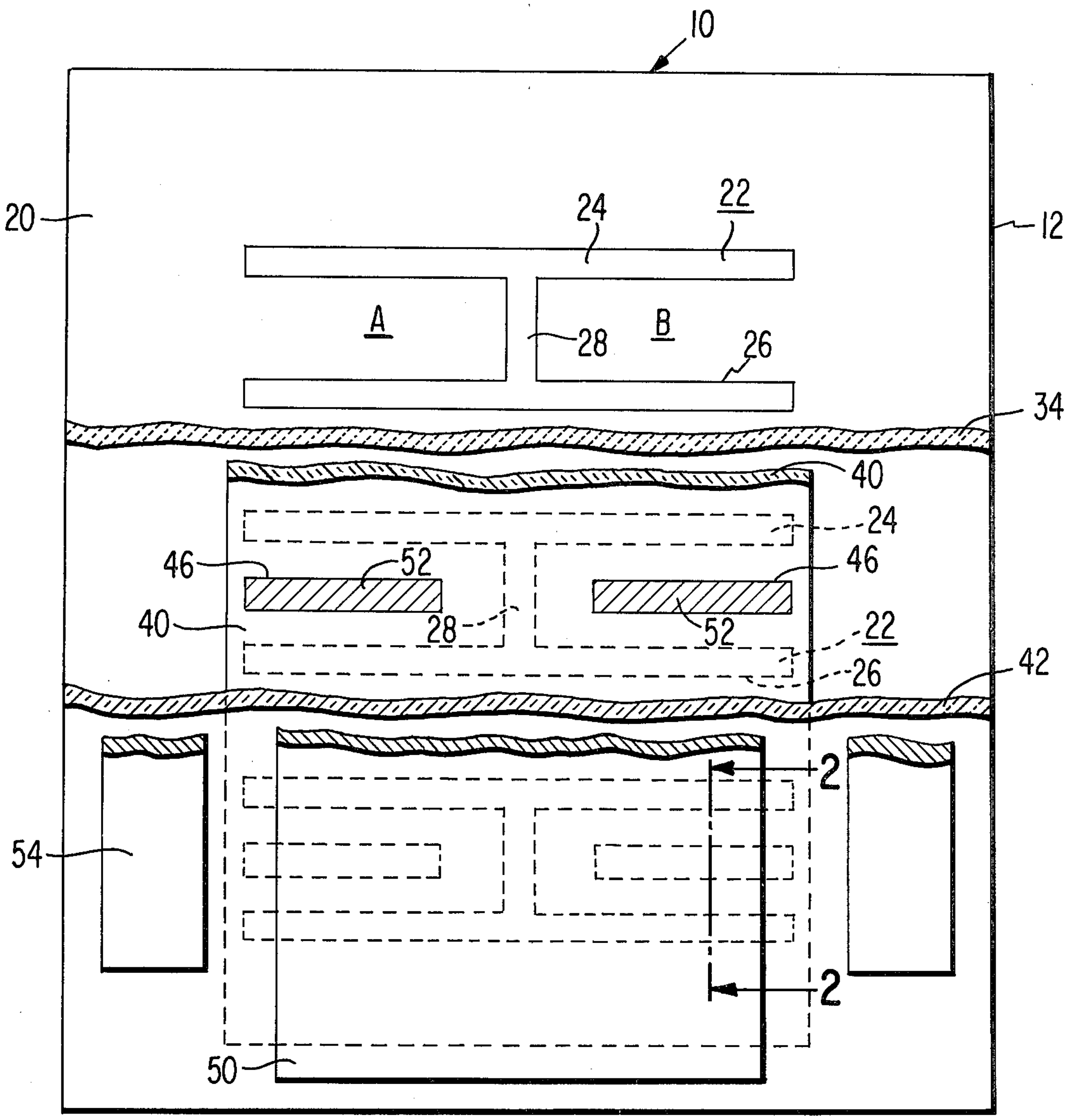
FIG. 1 is a top view, partially broken away to expose various layers, of a portion of a transistor made in accordance with the instant invention.
Figure 2:
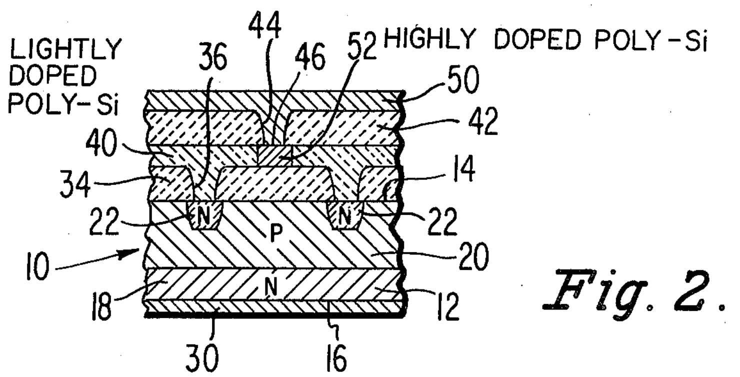
FIG. 2 is a cross-sectional view taken along the line 2—2 of FIG. 1.

With reference to FIGS. 1 and 2, a semiconductor device 10, in accordance with the invention, comprises a body 12 of semiconductor material, e.g., silicon, having a pair of opposed surfaces 14 and 16, and a number of different regions within the body 12 forming emitter, base, and collector regions of a transistor. Thus, within the body 12 at the lower surface 16 thereof is a region 18 of N type conductivity which is the collector region of the device. Disposed within the body 12 in contact with the collector region 18 is a base region 20 of P type conductivity. The base region 20 extends to the surface 14 of the body 12 and surrounds a number of spaced apart regions 22 of N type conductivity. The various regions 22 collectively form the emitter of the transistor, each of the regions 22 also being referred to as an emitter site.

As shown in FIG. 1, each emitter site 22 is in the form of the letter H, having two parallel arms or branches 24 and 26, and a branch 28 transverse to and connecting together the two branches 24 and 26. In one embodiment of the invention, each branch 24 and 26 has a length of 2 mils (about 50 micrometers), the branch 28 has a length of 0.40 mil (about 10 micrometers), and each of the branches has a width of 0.06 mil (about 1.5 micrometers). Thus, the ratio of peripheral length of each emitter site to the surface area thereof is about 33 to 1.

A metal contact 30 (FIG. 2), e.g., of aluminum, is disposed on the lower surface 16 in ohmic contact with the collector region 18.

Overlying the surface 14 of the body 12 is a layer 34 (FIG. 2) of insulating material, e.g., silicon dioxide. Openings 36 are provided through the layer 34 to expose surface portions of each emitter site 22. Preferably, substantially the entire length of each of the branches 24, 26, and 28 of each emitter site is exposed, the purpose of this being to promote uniform ballasting of the various portions of each site 22, as described hereinafter.

Overlying a portion of the layer 34 and extending through the openings 36 therethrough into contact with the emitter sites 22 is a layer 40 of an electrical resistive material, e.g., lightly doped silicon. While other materials such as nichrome and tantalum can be used for this layer, silicon is preferred since it is so widely used in the semiconductor arts. Since the silicon layer 40 is deposited primarily on the layer 34 of silicon dioxide, the layer 40 is most likely of polycrystalline material. However, whether the layer 40 is polycrystalline or of monocrystalline material is of no significance. The deposition of such lightly doped polycrystalline silicon layers is well known. In one embodiment of the invention, for example, the layer 40 has a thickness of 5,000 Angstroms, and is doped with phosphorous to a sheet resistance of 25 ohms per square.

As shown in FIG. 1, the resistive layer 40 does not cover all of the insulating layer 34, i.e., it does not overlie some surface portions of the base region 20. As described hereinafter, this simplifies making electrical contacting to the base region 20.

Overlying the resistive layer 40 and extending onto the insulating layer 34 at those locations where it is not covered by the resistive layer 40 is a layer 42 of an insulating material, e.g., silicon dioxide. Openings 44 (FIG. 2) are provided through the layer 42 to expose surface portions 46 of the resistive layer 40. As shown in FIG. 1, these surface portions 46 are in the shape of elongated rectangles, and are disposed between the parallel branches 24 and 26 of each emitter site 26, one exposed surface portion 46 being located on each side of the connecting branch 28. The location of these exposed surface portions 46 relative to the various branches of each emitter site is important with respect to providing uniform electrical contacting to and uniform ballasting of each site, as is described hereinafter.

Overlying portions of the insulating layer 42 and extending through the openings 44 therethrough into contact with the exposed surface portions 46 of the layer 40 is a metal contact 50. The contact 50 extends over each emitter site 22. To make good ohmic contact between the metal contact 50 and the polysilicon layer 40, portions 52 of the layer 40 beneath the exposed surface portions 46 (referred to hereinafter as "contact" portions 46) are doped to a high conductivity. In the fabrication of such devices, the doping of the portions 52 can be done through the openings 44 through the insulating layer 42 prior to the provision of the metal contact 50, the layer 42 serving as a doping mask in the process.

Overlying the insulating layer 42 to either side of the layer 40 (FIG. 1) is a metal contact 54. The contact 54 extends through coincident openings (not shown) through the layers 42 and 34 into contact with surface portions of the base region 20. Preferably, the base region 20 includes portions (not shown) of high conductivity underlying the metal contact 54 and engaged therewith for improving the ohmic contacting of the contact 54 with the base region. The base region contacting arrangement is not described more fully since it can be identical to the base region contacting arrangement shown in the aforecited Carley patent.

From FIGS. 1 and 2 it can be seen that the current flow from each emitter site 22 to the overlying metal contact 50 is through a portion of the resistive layer 40 of polycrystalline silicon. Of importance is that each site 22 is ballasted substantially independently of the other sites. Thus, if one site 22 tends to draw an excessive amount of current, reduction of the forward biasing thereof, tending to limit the current to that site, does not affect the biasing of the other emitter sites.

Also, the ballasting or resistive voltage drop from the contact regions 46 through the ballast layer 40 to each portion of each emitter site 22 is substantially the same over the extent of each site. This is accomplished by so shaping and positioning the contact portions 46 relative to the emitter site branches that the product of the current and the resistance through the ballast layer 40 between the contact portions 46 and the emitter site branches is substantially the same from portion to portion of the periphery of each emitter site.

For example, with the device geometry shown in FIG. 1, both sides of the connecting branch 28 of the emitter site 22 face a contact portion 46, whereas only one side of each of the branches 24 and 26 faces a contact portion 46. Thus, for a given current per unit length of the periphery of each of the branches, the current density through the resistive layer 40 between the connecting branch 28 and each of the contact portions 46 associated therewith is only half the current density through the resistor layer 40 between each half of a branch 24 or 26 and its associated contact portion 46. Since the resistive layer 40 is of substantially uniform resistivity throughout, the amount of ballasting provided thereby, i.e., the amount of series resistance, is directly related to the length of the current paths therethrough. Therefore, to equalize the voltage drops through the resistive layer 40 to provide substantially uniform ballasting for each portion or segment of the emitter site 22, the minimum or perpendicular spacing between the facing edges of the contacts 46 and the connecting branch 28 is made twice the spacing between the facing edges of the contacts 46 and the branches 24 and 26. Thus, the differences in current densities flowing between the different site branches and the contact portions 46 associated therewith are compensated for by the differences in current path lengths. Thus, all portions of each emitter site 22 are substantially uniformly ballasted with the result that each portion is uniformly biased and injects a uniform amount of current into the base region. Such uniform current injection about the periphery of each emitter site is desirable for efficient performance of the device.

Figure 3:
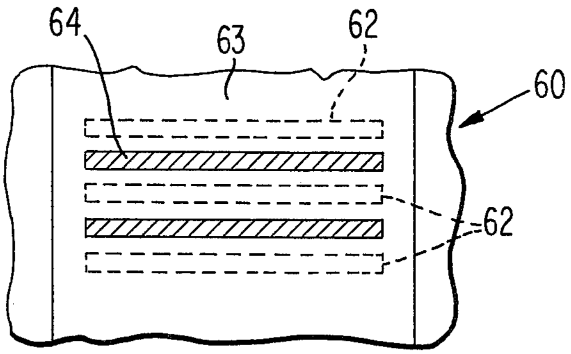
( PRIOR ART ) Fig. 3.
FIG. 3 is a top view, partially broken away, of a portion of a prior art transistor.

An example of a known prior art device is shown in FIG. 3. This figure corresponds, with respect to the number of upper layers of the finished device removed, to the middle section of the device 10 shown in FIG. 1. In this device 60, of the "overlay" type, a plurality of spaced apart emitter sites 62 is provided, and a ballasting arrangement, similar to the one used in the device 10 of the instant invention, is used. Thus, a layer 63 of resistive material is used, the contact portions 64 (shown shaded in FIG. 3) between the overlying metal contacts (not shown) and the resistive layer being disposed between each of the emitter sites 62.

In comparison with the prior art device 60, devices in accordance with the instant invention can have significantly higher emitter peripheral length (owing to the presence of the transverse branch 28, as shown in FIG. 1) without necessarily causing any additional crowding together of the emitter sites. For example, the parallel branches 24 and 26 of the inventive device 10 can be of exactly the same dimensions and spacing as the emitter sites 62 of the prior art device 60. Thus, while increasing the peripheral length of the individual emitter sites, there is, in devices of the instant invention, little or no increase of complexity of the processes or apparatus (e.g., photomasks) used to fabricate the device. Additionally, in spite of the increased complexity of the shape of each emitter site of the inventive devices (e.g., the H shape of the emitter sites 22 compared to the simple elongated rectangular emitter sites 62 of the prior art device 60), substantially uniform ballasting of each portion of each emitter site 22 is still provided in accordance with this invention.

Figure 4:
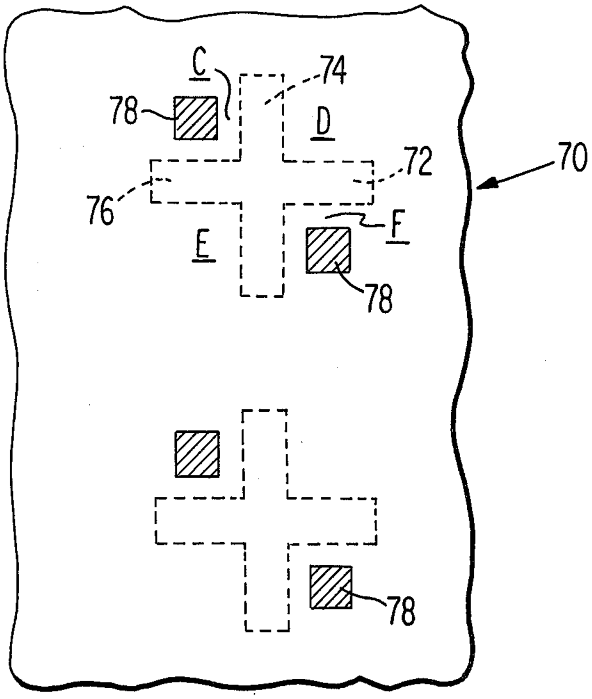
FIG. 4 is a view similar to that of FIG. 3 but showing another embodiment of the instant invention.

In FIG. 4 is shown another embodiment of the instant invention. In this device 70, each emitter site 72 has the shape of a cross including transversely oriented branches 74 and 76. Ballasting is similar to the arrangement shown in FIGS. 1 and 2, with the metal contact-to-resist layer contact portions 78 being in diagonally opposed quadrants of the emitter cross.

In this embodiment, the "facing" relationship of each branch 74 and 76 with respect to a contact portion 78 is the same, and uniform ballasting of the various portions of each emitter site is achieved by providing equal spacing of each contact portion 78 with each branch 74 and 76. Thus, all portions of each emitter site are substantially uniformly ballasted. In this embodiment, each branch 74 and 76 has a length (from end to end of each branch) of 0.40 mil (about 10 micrometers), and a width of 0.06 mil (about 1.5 micrometers). Thus, the ratio of total peripheral length to surface area is about 35 to 1.

In the embodiments of the invention shown in FIGS. 1, 2 and 4, the emitter sites 22 and 72, as described, include joined branches which extend transversely or angularly of one another. For convenience of description, it is noted that the branches of each emitter site at least partially encompass or define at least two spaced apart areas of the surrounding base region. For example, in FIG. 1, each half of the H emitter site 22, defined by the branch 28 and the portions of each branch 24 and 26 on either side of the branch 28, partially encompass an area, designated by the letters A and B, of the surrounding base region 20. Likewise, in FIG. 4, the crossed branches 74 and 76 partially encompass or define areas C, D, E, and F of the surrounding base region 77. Uniform ballasting of the various portions or branches of each emitter site is achieved by disposing the contacts (identified by the reference numerals 46 and 78 in FIGS. 1 and 4, respectively) between the resistive ballasting layer (40 in FIG. 1) and the emitter metal contact (50 in FIG. 1) to overlie these partially encompassed or defined base regions. By so arranging the edges of the contact portions 46 and 78 to provide a substantially uniform voltage drop to the edges of the corresponding or associated emitter branches, substantially uniform ballasting is obtained.

A principal advantage of the invention is that the emitter peripheral length is increased, thus improving the current handling capability of the device, while not increasing the area of the base region. Thus, the base to collector capacitance of the device is not increased, which, as known, is desirable.

What is claimed is:

1. A transistor comprising:

a body of semiconductor material having a surface, a number of spaced apart emitter sites and a base region surrounding, at said surface, each of said emitter sites, each said emitter site being generally in the shape of the letter H, including a pair of side-by-side elongated branches, and a transverse branch joining said elongated branches intermediate the ends thereof, a layer of electrically resistive material overlying and in contact with surface portions of said emitter branches, and a metal contact overlying said resistive layer, spaced apart portions of said resistive layer being contacted by said metal contact, said metal-contacted resistive layer portions being disposed between said elongated branches and spaced from said transverse branch, the spacing between the edges of said metal-contacted resistive layer portions and the edges of said elongated branches being about one half the spacing between the edges of said metal-contacted resistive layer portions and the edges of said transverse branch to provide uniform ballasting over the extent of said branches.

* * * * *